(12) United States Patent
Ribellino et al.

(10) Patent No.: US 6,388,505 B1
(45) Date of Patent: May 14, 2002

(54) INTEGRATED CIRCUIT GENERATING A VOLTAGE LINEAR RAMP HAVING A LOW RAISE

(75) Inventors: Calogero Ribellino, Sommatino; Patrizia Milazzo, Messina; Francesco Pulvirenti, Acireale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/473,899

(22) Filed: Dec. 28, 1999

(30) Foreign Application Priority Data

Dec. 29, 1998 (EP) .............................. 98830792

(51) Int. Cl.$^7$ ................................................ G05F 1/10
(52) U.S. Cl. ........................................ 327/536; 327/336
(58) Field of Search .............................. 327/91, 93, 94, 327/96, 131, 336, 344, 536, 390, 124, 126, 127, 134, 337

(56) References Cited

U.S. PATENT DOCUMENTS

| | | | | |
|---|---|---|---|---|
| 4,986,919 A | * | 1/1991 | Allington .................... 210/656 |
| 5,760,623 A | * | 6/1998 | Hastings ..................... 327/137 |
| 5,774,390 A | * | 6/1998 | Tailliet ........................ 364/807 |
| 5,982,223 A | * | 11/1999 | Park et al. .................. 327/536 |
| 6,016,073 A | * | 1/2000 | Ghilardelli et al. ......... 327/536 |
| 6,037,622 A | * | 3/2000 | Lin et al. .................... 327/536 |

FOREIGN PATENT DOCUMENTS

| | | |
|---|---|---|
| EP | 0 653 841 A | 5/1995 |
| EP | 0 745 996 A | 12/1996 |
| EP | 0 881 770 A | 12/1998 |
| FR | 2 752 114 A | 2/1998 |

\* cited by examiner

*Primary Examiner*—Toan Tran
*Assistant Examiner*—Linh Nguyen
(74) *Attorney, Agent, or Firm*—Lisa K. Jorgenson; Michael J. Donohue; Seed IP Law Group, PLLC (57) ABSTRACT

An integrated circuit voltage ramp generator is presented. The circuit includes at least one operational amplifier having a non-inverting input terminal connected to a voltage reference, and having an output terminal coupled in a feedback relationship to an output terminal of the generator circuit. The ramp voltage generator further includes a first storage capacitance connected between the non-inverting input terminal of the operational amplifier and a ground reference, which is loaded by means of a second pumping capacitance connected in parallel to the first capacitance. The pumping and voltage generation is and controlled by a series of passgates coupled to clock signals.

21 Claims, 4 Drawing Sheets

$$\frac{\Delta V_{RAMP}}{\Delta t} = \frac{300mV}{ms}$$

INTEGRATED CIRCUIT GENERATING A VOLTAGE LINEAR RAMP HAVING A LOW RAISE

TECHNICAL FIELD

The present invention relates to an integrated circuit generator that generates a linear voltage ramp having a low raise, and more specifically to a battery and battery charging system in particular for use with cellular telephony.

BACKGROUND OF THE INVENTION

In particular but not exclusively, the invention relates to an integrated circuit for cellular telephony applications and the following description is made with reference to this field of application, only in order to simplify its illustration. Discussion of processes and devices well known to those skilled in the art has been abbreviated or eliminated for brevity.

When the battery of the mobile phone equipment has run down, it is very important to charge it with a constant current and having a lower value than that provided by the battery-charger. When the battery reaches a voltage value where it can again operate the phone, it is best charged in (Pulse Width Modulation) PWM mode, i.e., with the maximum current available from the battery charger, but with a frequency and a duty cycle that are managed by a microprocessor MP.

Because of the above considerations, a charging slew rate for the battery must be controlled to about 600 mA/ms, in order to avoid the possibility that a quick current rise may interrupt the communication.

Figure 1:
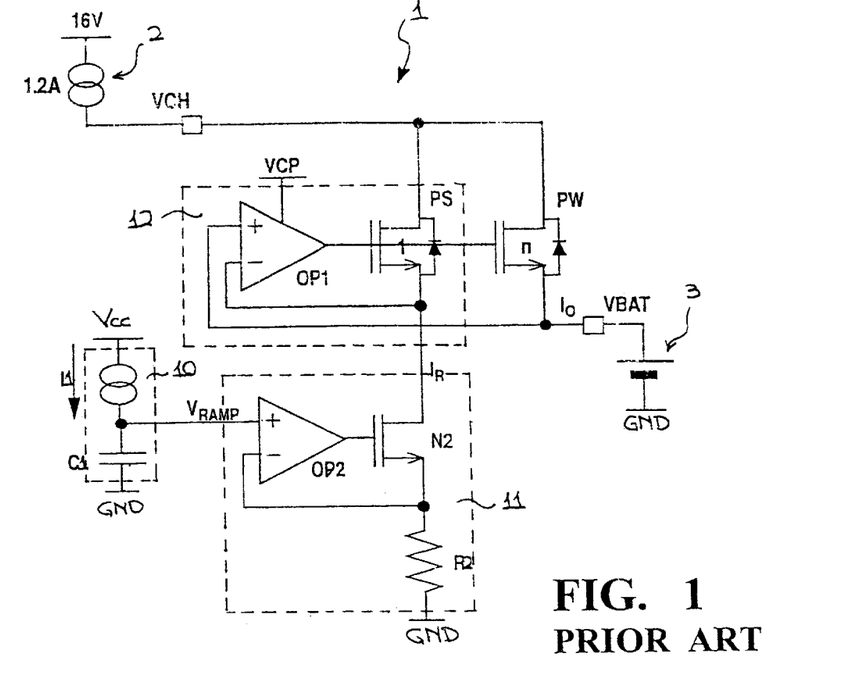
FIG. 1 is a schematic diagram showing a circuit for controlling the switching edge signals of a power transistor, realised according to the prior art.

A known solution, disclosed in the European Patent number 0 881 770, in the name of the Applicant, and incorporated by reference, is shown in FIG. 1. In particular, in the circuit 1 of FIG. 1, a voltage signal is used (VRAMP) having a controlled rising and falling edges: This voltage signal VRAMP is converted to a current signal (IR) that is then mirrored at the output of the device (IO) on a power transistor, thus obtaining a precise control of the leading edge current signal of the transistor.

In circuit 1, hence, a MOS transistor is used in order to obtain low signal propagation times between input and output and a very precise control of the output current and of the switching signal edges.

Circuit 1 is inserted between a battery-charger, schematically indicated with 2 and represented by a current generator connected to a VCH terminal, and a battery 3 connected to a VBAT terminal. It is possible to distinguish in the circuit 1 the following circuit portions: a power transistor PW of MOS type having a Drain-Source main conduction path connected between the VCH and VBAT terminals of the circuit; a drive circuit 12 of the power transistor PW including an operational amplifier OP1, fed by a positive voltage VCP higher than the voltage of terminal VCH, and a transistor PS coupled to the power transistor PW; a voltage-current converter block 11 having an operational amplifier OP2, a transistor N2 and a resistance R2, with the task of converting a voltage waveform VRAMP at its positive input in a current waveform $I_R$ proportional to the value of the resistance R2; a variable voltage generator with controlled signal edges VRAMP comprising a current generator I1 and a low-pass filter, schematically illustrated by a capacitor C1.

An analysis of the generation of the current $I_R$ is as follows. The value set on the current generator I1 is filtered by the low-pass filter C1 obtaining a voltage signal VRAMP with controlled signal edges. By means of the voltage-current converter block 11, the voltage VRAMP, applied at a non-inverting input of the operational OP2, is converted in a current $I_R$, with a time pattern the same as the signal VRAMP, and whose value is inversely proportional to the resistance R2.

The current slew rate is defined by the following equation:

$$\frac{\Delta I_O}{\Delta t} = n \times \frac{\Delta I_R}{\Delta t} = n \times \frac{\Delta V_{RAMP}}{\Delta t} \times \frac{1}{R2} = n \times \frac{I1}{C1} \times \frac{1}{R2} \quad (1)$$

wherein n is the area ratio of the transistors PS and PW.

The current $I_R$ is multiplied by the area ratio of the transistors PS and PW generating the output current $I_O$ supplied to the battery 3. The operational amplifier OP1 has the function of driving the gate node VG of the transistors PS and PW in order to maintain the current ratio $I_O/I_R$ set by the area ratio n between PS and PW.

The charge current leading signal edges of the battery are controlled by means of such circuit; therefore it is possible to adjust the slew rate in accordance to the application.

In the field of cellular telephony, the current slew rate required is 600 mA/ms; if n=1000 and R2=500Ω, it is necessary to generate a voltage ramp ΔVRAMP/Δt=300 mV/ms.

One way of generating such linear voltage ramp is that of loading a capacitance with a constant current I; in such a case, if I=1 μA, a capacitance C=3.33 nF is required.

Circuit 1 of known type generates the required voltage ramp in that it loads a capacitance C1 by means of a constant current generator. The disadvantage of such solution is that the capacitance C1 cannot be integrated because of its very high value, which is necessary for obtaining very slow voltage ramps as required by the specific application.

SUMMARY OF THE INVENTION

Embodiments of the invention include a voltage generator circuit that can be completely integrated and provides a very slow linear voltage ramp for use with cellular telephony, having structural and functional features that overcome the limitations of the devices realized according to the prior art.

Described is a "storage" capacitance that is loaded "packet-wise" by means of a "pumping" capacitance, which is in turn loaded with always the same voltage reference and clock frequency.

Thus provided is a generating circuit that has an input terminal connected to a first voltage reference, and that has an output terminal for providing a controlled ramp signal ($V_{RAMP}$). The generating circuit has at least one operational amplifier coupled to the input terminal and held in a feedback loop. The generating circuit has a first storage capacitor connected between the non-inverting input terminal of the operational amplifier and a ground reference, and loaded by a second pumping capacitance inserted in parallel to the first capacitance between the input terminal of the ramp generator circuit and the ground reference.

The features and the advantages of the device according to the invention will result from the following description of an embodiment thereof which is reported for indicative and non limiting purposes, with reference to the attached drawings.

DETAILED DESCRIPTION

Figure 2:
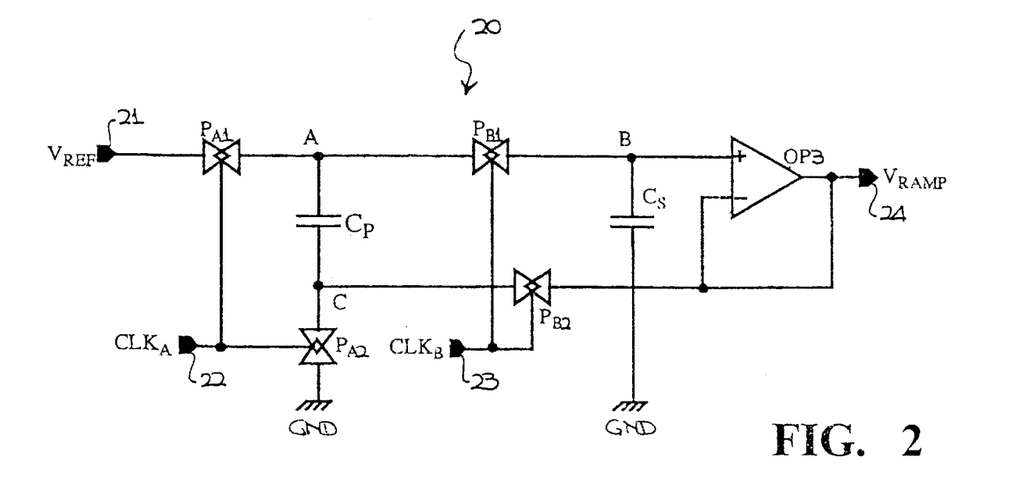
FIG. 2 is a schematic diagram showing a ramp generator circuit realised according to an embodiment of the present invention.

With reference to the drawings, the linear ramp generator circuit according to an embodiment of the invention is globally and schematically indicated with numeral 20. The ramp generator circuit 20 can be completely integrated and is able to generate a very slow linear voltage ramp.

The ramp generator circuit 20 has an input terminal 21, a first and a second control terminal 22, 23. The terminal 21 is connected to a voltage reference VREF, while the terminals 22 and 23 receive a first and second clock signal CLKA, CLKB respectively. Further on, an output terminal 24 is provided, to provide a controlled ramp voltage signal VRAMP.

The ramp generator circuit 20 includes an operational amplifier OP3 as well as a first, second, third and fourth active passgates PA1, PA2, PB1 and PB2, respectively.

The operational amplifier OP3 has a non-inverting input terminal connected to the input terminal 21 of the ramp generator circuit 20 by means of the series of the first and third active passgates PA1, PB1, as well as an inverting input terminal connected to the output terminal, in turn connected to the output terminal 24 of the ramp generator circuit 20 itself.

The active passgates PA1 and PA2 have respective drive terminals connected each other and to said first control terminal 22 of the ramp generator circuit 20. Analogously, the active passgates PB1 and PB2 have respective drive terminals connected each other and to said second control terminal 23 of the ramp generator circuit 20.

Inside the ramp generator circuit 20 it is possible to distinguish a first, a second and a third inner circuit node A, B and C, respectively. The first node A is located between the first active passgate PA1 and the second active passgate PB1 and it is connected to a reference signal, in particular a ground reference GND, by means of the series of a so-called "pumping" capacitance Cp and of the third passgate PA2.

The second node B is located between the second passgate PB1 and the non-inverting input terminal of the operational amplifier OP3 and it is connected to the mass GND by means of a so-called "storage" capacitance Cs.

The third node C is located between the "pumping" capacitance Cp and the third passgate PA2 and it is connected to the output terminal 24 of the ramp generator circuit 20 by means of the fourth passgate PB2.

With the structure described for the ramp generator circuit 20, it is possible to load "packet-wise" the so-called "storage" capacitance Cs by means of the "pumping" capacitance Cp, which is loaded always at the voltage reference VREF with the clock frequency.

In particular, the passgates PA1, PA2 and PB1, PB2 are active passgates when the control signal applied to their drive terminals is at a first logical value, for example at a high or logic value of "1".

Figures 3, 4:
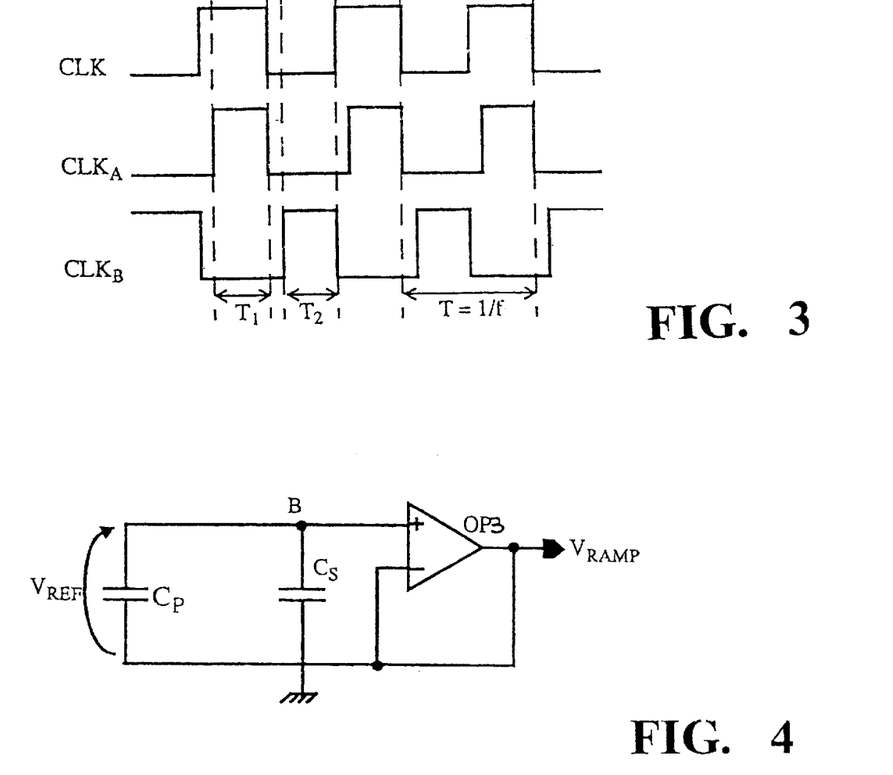
FIG. 3 is a graph showing the pattern as a function of time of signals generated inside the generator circuit of FIG. 2.
FIG. 4 is a schematic diagram showing an electrical simplification of a detail of the generator circuit of FIG. 2 in a first operating condition.

It is useful to note that the clock signals CLKA and CLKB are generated by a clock signal CLK of the ramp generator circuit 20 according to the pattern shown in FIG. 3.

During the time interval T1 the passgates PA1, PA2 are closed i.e., signals pass freely through the passgates, and the passgates PB1, PB2 are open i.e., no signal passes through the passgates; the "pumping" capacitance CP is loaded at the voltage VREF. The amount of charge stored in said "pumping" capacitance CP is:

$$Q_{Cp} = C_p \times V_{REF} \qquad (2)$$

Then, during the time interval T2, the passgates PA1 and PA2 are open and the passgates PB1 and PB2 are closed; the charge stored by the "pumping" capacitance Cp splits between the two capacitances of "pumping" Cp and "storage" Cs:

$$Qtot = Q_{Cp} = C_p \times V_{REF} = (C_p + C_s) \times V_2 \qquad (3)$$

Hence, after the first cycle of clock signals CLK, the "storage" capacitance is loaded at the voltage:

$$V_{RAMP} = \frac{Cp}{Cp + Cs} \times V_{REF} \qquad (4)$$

In order to guarantee the voltage ramp linearity, it is required that also in the next clock signal cycles the amount of charge that is transferred from the "pumping" capacitance Cp to the "storage" capacitance Cs be always the same.

To this end, during the time interval T2, the third node C is connected to the output terminal 24 of the operational amplifier OP3, as schematically shown in FIG. 4, replacing the passgates PA1 and PA2, PB1 and PB2 with the respective electrical equivalents (short circuit or open circuit).

As is evident from FIG. 4, at the time the passgates PB1 and PB2 are closed, the voltage at the second node B is equal to $$V_{RAMP}^{(n)} = V_{REF} + V_{RAMP}^{(n-1)} \qquad (5)$$

The amount Q of charge transferred to the n-th cycle by the "pumping" capacitance Cp to the "storage" capacitance Cs is given by the following formula:

$$Q = C_p \times (V_{RAMP}^{(n)} - V_{RAMP}^{(N-1)}) = Cp \times (V_{REF} + V_{RAMP}^{(n-1)} - V_{RAMP}^{(n-1)}) = Cp \times V_{REF} \qquad (6)$$

that is to say, the amount Q of charge is equal to that transferred during the first cycle, when the "storage" capacitance Cs was completely discharged.

Figure 5:
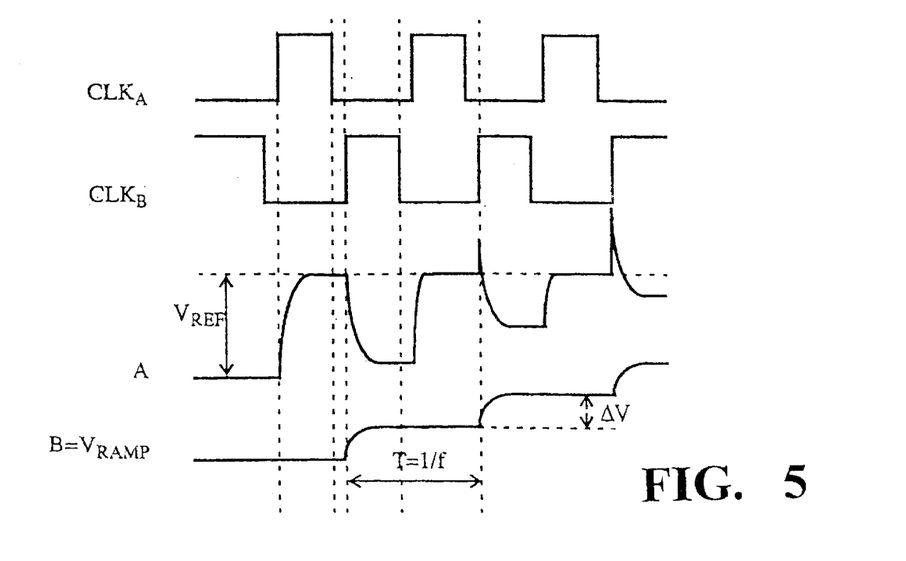
FIG. 5 is a graph showing the pattern of the main waveforms of the generator circuit of FIG. 2.

The pattern of voltages at the first node A and at the second node B (the signal at node B being equal to $V_{RAMP}$) is shown in FIG. 5.

As the amount of charge transferred is always the same, the voltage step ΔV is equal to the voltage at node B after the first charging cycle, that is to say $$\Delta V = \frac{Cp}{Cp + Cs} \times V_{REF} \quad (7)$$

In order to obtain the value of slew rate of the VRAMP voltage, it is enough to divide ΔV by the clock signal CLK period T (or to multiply it by the frequency f), thus obtaining:

$$\frac{\Delta V_{RAMP}}{\Delta t} = \frac{\Delta V}{T} = \frac{Cp}{Cp + Cs} \times \frac{V_{REF}}{T} = \frac{Cp}{Cp + Cs} \times V_{REF} \times f \quad (8)$$

As is evident from FIG. 5 that shows the principle pattern of the principal waveforms, the voltage ramp that is obtained is not a straight line but a ramp consisting of individual steps corresponding to the value ΔV.

In order to decrease the value ΔV, and therefore render the voltage ramp as close as possible to the pattern of a straight line, it is possible to adjust the parameters of the equation (8). Supposing to fix the voltage value VREF and the pumping capacitance Cp, it is possible, by varying the other parameters, to obtain different patterns of the VRAMP voltage, as shown in FIG. 6.

Figure 6:
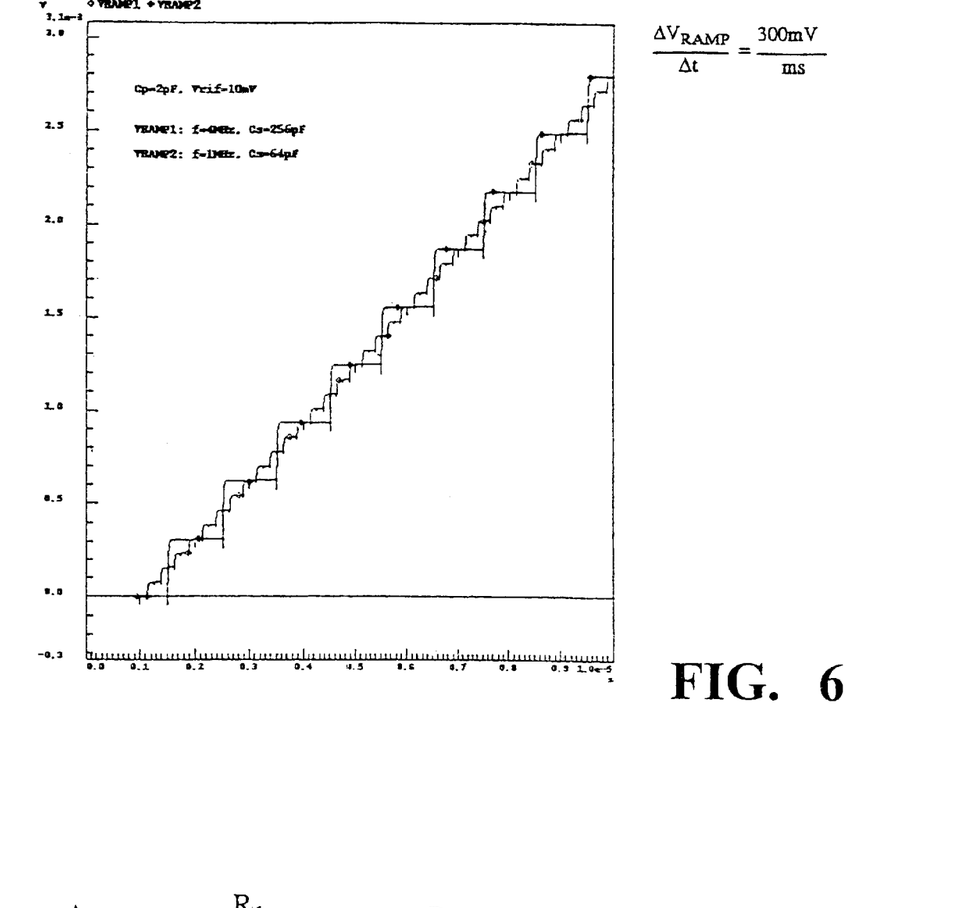
FIG. 6 is a graph showing the pattern as a function of time of signals obtained by means of electrical simulation of the generator circuit of FIG. 2.

From FIG. 6, it can be deduced that for values of the "storage" capacitance Cs much higher than those of the "pumping" capacitance Cp, the voltage step ΔV is remarkably reduced.

It is further evident that the half-period of the clock signal CLK must be bigger than the loading time constant of the "storage" capacitance Cs.

Figure 7:
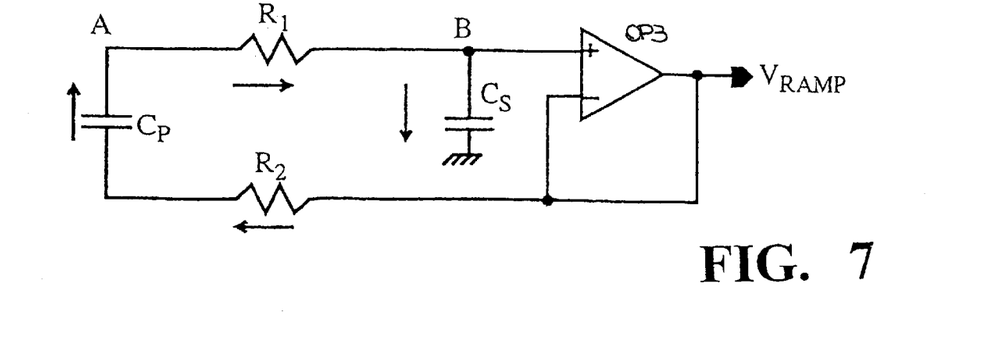
FIG. 7 is a schematic diagram showing an electrical simplification of a detail of the generator circuit of FIG. 2 in a second operating condition.

In FIG. 7, the electrical equivalent of the ramp generator circuit 20 of FIG. 2 is represented during the time interval T2 wherein passgates PA1 and PA2 are open and passgates PB1 and PB2 are closed. In this electrical equivalent, the resistances R1 and R2 for passgates PB1 and PB2 have been respectively introduced in series in order to correctly calculate the time constants.

In particular, as result, the circuit time constant τ is equal to:

$$\tau = (R1 + R2) \times \frac{C_P \times C_S}{C_P + C_S} \quad (9)$$

in the equation (8), for the calculation of the slew rate to be correct, it is needed that the time constant τ be less than the half-period T2 during which the "storage" and "pumping" capacitances Cp and C, respectively, are connected through the passgates PB1 and PB2.

The following equation becomes true:

$$T2 = \frac{T}{2} = \frac{1}{2 \times f} > 4 \times \tau \quad (10)$$

that is to say $$f < \frac{1}{8 \times \tau} \quad (11)$$

If such condition is not satisfied, it is needed to correct the slew rate formula introducing the exponential term as well, thus obtaining:

$$\frac{\Delta V_{RAMP}}{\Delta t} = \frac{C_P}{C_P + C_S} \times V_{REF} \times f \left[ 1 - e^{-\frac{T}{2\tau}} \right] \quad (12)$$

$$= \frac{C_P}{C_P + C_S} \times V_{REF} \times f \left[ 1 - e^{-\frac{1}{2f\tau}} \right]$$

Another factor to be considered is the leakage current on the second node B, which, during the T1 interval, would cause the "storage" capacitance Cs to discharge, influencing the slew rate final value. In order to attenuate the effect of the leakage current, it is advisable to use a "storage" capacitance Cs of very high value.

Assuming the leakage to be null, a good matching between the "pumping" capacitance Cp and the "storage" capacitance Cs to exist and further disregarding the offset of the operational amplifier OP3, the error which occurs in the calculation of the slew rate value and which is due to the process spreads, is given by:

$$\varepsilon\left[\frac{\Delta V_{RAMP}}{\Delta t}\right] = \frac{\Delta C_P}{C_P} + \frac{\Delta V_{REF}}{V_{REF}} + \frac{\Delta f}{f} - \frac{\Delta C_S}{C_S} = \frac{\Delta V_{REF}}{V_{REF}} + \frac{\Delta f}{f} \quad (13)$$

Therefore, the precision of the slew rate value essentially depends upon the precision of the voltage reference $V_{REF}$ and upon the clock signal frequency.

The ramp generator circuit 20 according to embodiments of the invention has the task of generating a rising linear voltage ramp.

Figure 8:
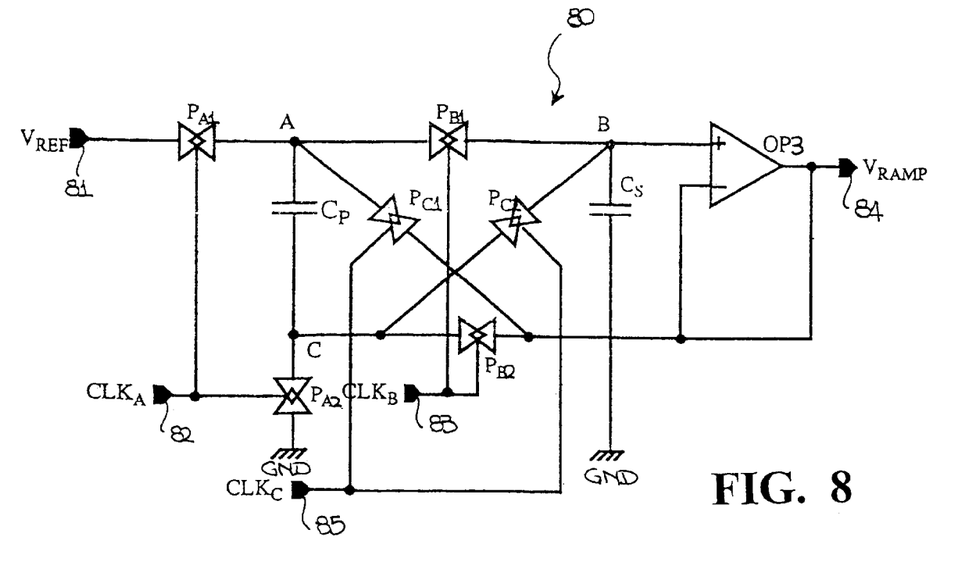
FIG. 8 is a schematic diagram showing a possible application of the generator circuit of FIG. 2.

Introducing two further passgates, it is possible to form a circuit 80 for generating also a falling linear voltage ramp, as illustrated schematically in FIG. 8.

The falling ramp generator circuit 80 has a base structure identical to the ramp generator circuit 20 of FIG. 2. Identical numerals have been used to indicate like elements in terms of arrangement and operation.

Analogously to the ramp generator 20 of FIG. 2, the generator circuit 80 has an input terminal 81, and a first and a second control terminal 82 and 83, respectively. Terminal 81 is connected to a voltage reference VREF, while terminals 82 and 83 receive a first and a second clock signal CLKA and CLKB respectively. An output terminal 84 is also provided, which is adapted to provide a controlled ramp voltage signal $V_{RAMP}$.

The generator circuit 80 further includes a fifth and a sixth passgate PC1 and PC2, inserted between the first node A and the output terminal 84 and the second node B and the third node C, respectively. Passgates PC1 and PC2 have respective drive terminals connected to a third control terminal 81, which in turn receives a third clock signal CLKC.

The passgates PC1 and PC2 are controlled by the third clock signal CLKC and permit the generation of the fall voltage ramp. The third clock signal CLKC is equal to the second clock signal CLKB. Advantageously, according to this embodiment of the invention, the two clock signals CLKB and CLKC cannot be simultaneously active. In this way, during the generation of the rising ramp, the passgates PC1 and PC2 are always open, because the second clock signal CLKB is active, whereas in dual way during the falling ramp, the passgates PB1 and PB2 are always open and the active signal is the third clock signal CLKC.

An analysis of the rise ramp generator circuit 80 will be now carried out, assuming that the storage capacitance Cs is loaded at the final voltage $V_{RAMP}$.

During the half-period T1, the "pumping" capacitance loads up to the reference voltage $V_{REF}$ by means of the passgates PA1 and PA2. During the half-period T2, the passgates PC1 and PC2 are closed and the voltage at the second node B becomes equal to:

$$V_{RAMP}^{(n)} = V_{RAMP}^{(n-1)} V_{REF} \quad (14)$$

Hence, the amount of charge transferred by the "pumping" capacitance Cp to the "storage" capacitance Cs is equal to:

$$Q = C_P \times (V_{RAMP}^{(n)} - V_{RAMP}^{(n-1)}) = C_P \times (V_{RAMP}^{(n-1)} - V_{REF} - V_{RAMP}^{(n-1)}) \quad (15)$$
$$= -(C_P \times V_{REF})$$

The sign "−" on the transferred charge indicates that the "storage" capacitance Cs discharges according to a sequence of charge packets always of the same value.

Figure 9:
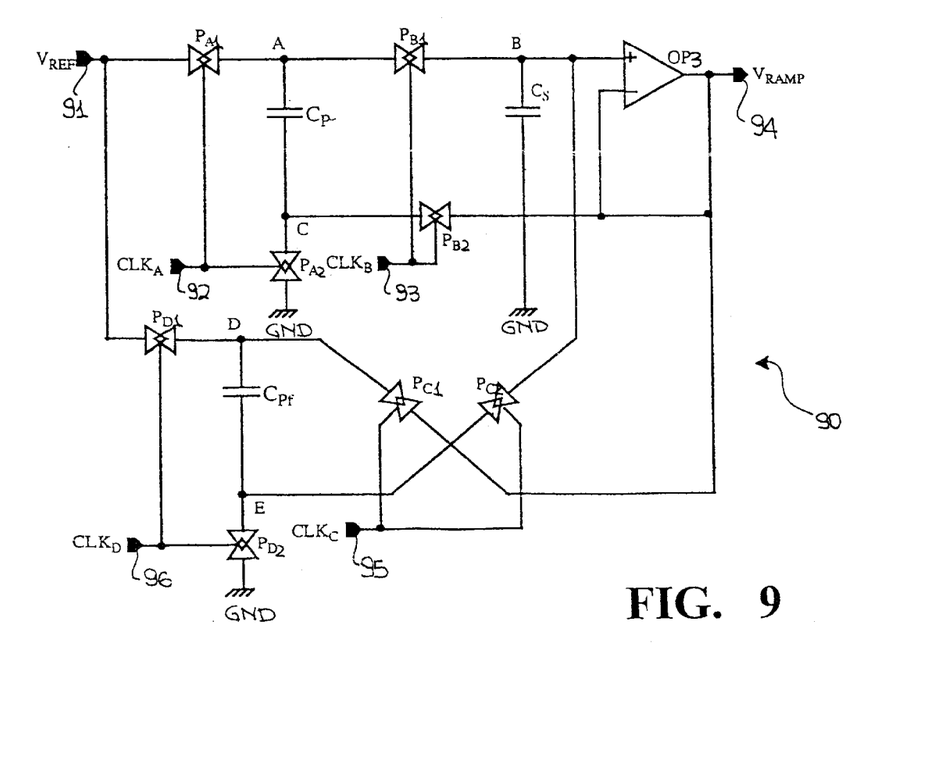
FIG. 9 is a schematic diagram showing a different embodiment of the generator circuit of FIG. 8.

A further simple modification allows the generator circuit 90 to produce two voltage ramps, one of which is a rising ramp and the other is a falling ramp, with different slew rates, as illustrated in FIG. 9.

The double ramp generator circuit 90 has a base structure which is identical to that of the ramp generator circuit 20 of FIG. 2, and to that of the fall ramp generator circuit 80 of FIG. 8. Identical numerals have been used to indicate like elements in terms of arrangement and operation.

Analogously to the ramp generator circuit 20 of FIG. 2 and to the fall ramp generator circuit 80 of FIG. 8, the double ramp generator circuit 90 has an input terminal 91, a first and a second control terminal 92 and 93. The terminal 91 is connected to a voltage reference VREF while the terminals 92 and 93 receive a first and a second clock signal CLKA, CLKB, respectively. An output terminal 94 is further provided, adapted for providing a controlled ramp voltage signal $V_{RAMP}$.

The generator circuit 90 further comprises of a fifth and a sixth passgates PC1 and PC2, having respective drive terminals connected to a third control terminal 95 of the generator circuit 90 as well as a seventh and an eighth passgates PD1 and PD2, having respective drive terminals connected to a fourth control terminal 96 of the generator circuit 90.

In particular, the fifth and the seventh passgates PC1 and PD1, respectively, are connected in series between the input terminal 91 and the output terminal.

The double ramp generator circuit 90 further includes an additional "pumping" capacitance Cpf, provided in series to the eighth passgate PD2, between a fourth node D intermediate between passgates PD1 and PC1, and the ground reference GND.

Finally, the sixth passgate PC2 is inserted between the second node B and a further fifth node E, intermediate with respect to the additional pumping capacitance Cpf and to the eighth passgate PD2.

Maintaining the parameters f, Cs and $V_{REF}$ unchanged, it is possible to generate, by means of the generator circuit 90 of FIG. 9, two respective voltage ramps, the one being a rising ramp, the other being a falling ramp. This is effected by suitably choosing the values of the pumping capacitance Cp and Cpf, respectively.

The generator circuits according to embodiments of the invention find particular application in the interface between battery-charger and main battery, whose main task is that of controlling the charging of the battery.

They also reduce the physical size of phone equipment and therefore the cost thereof, a requirement which is particularly felt in the field of the cellular telephony, reducing the number of discrete components present in the application.

The advantages obtainable by the generator circuits according to these embodiments of the invention are numerous, for example a full capability of being integrated, a slew rate value little dependent upon the process spreads; and wide range of application.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. An integrated voltage ramp generator circuit comprising:
   a circuit input terminal coupled to a first voltage reference;
   a circuit output terminal for providing a controlled ramp signal;
   an operational amplifier having a non-inverting input terminal connected to the circuit input terminal, and having an inverting input terminal coupled to the circuit output terminal;
   a pumping capacitor coupled between the non-inverting input terminal and the circuit output terminal;
   a storage capacitor connected between the non-inverting input terminal of the operational amplifier and a second voltage reference, and structured to be charged in parallel by the pumping capacitor; and
   first and second active passgates having respective drive terminals connected to each other and to a first control terminal of the ramp generator circuit and structured to receive a first clock signal.

2. The integrated voltage ramp generator according to claim 1, further comprising:
   third and fourth active passgates having respective drive terminals connected to each other and to a second control terminal of the ramp generator circuit and structured to receive a second clock signal; and
   first and second active passgates having respective drive terminals connected to each other and to a first control terminal of the ramp generator circuit and structured to receive a first clock signal.

3. The integrated voltage ramp generator according to claim 2, wherein the first active passgate is coupled between the first terminal of the pumping capacitor and a first terminal of the storage capacitor, wherein the second active passgate is coupled between the second terminal of the pumping capacitor and the circuit output terminal, wherein the third active passgate is coupled between the circuit input terminal and a first terminal of the pumping capacitor, and wherein the fourth active passgate is coupled between a second terminal of the pumping capacitor and the second voltage reference.

4. The integrated voltage ramp generator according to claim 3, further comprising:
   a fifth and a sixth active passgate, having respective drive terminals connected together and to a third control terminal of the ramp generator circuit, and structured to receive a third clock signal.

5. The integrated voltage ramp generator according to claim 4, wherein the fifth active passgate is coupled between the first terminal of the pumping capacitor and the circuit output terminal, and wherein the sixth active passgate is coupled between the first terminal of the storage capacitor and a second terminal of the storage capacitor.

6. The integrated voltage ramp generator according to claim 4, further comprising:

a third capacitor, coupled between the circuit input terminal and the second reference voltage in order to generate at least one further linear voltage ramp with a different slew rate.

7. The integrated voltage ramp generator according to claim 4, further comprising:

a seventh and eighth active passgate, having respective drive terminals connected together and to a fourth control terminal of the ramp generator circuit, and structured to receive a fourth clock signal.

8. The integrated voltage ramp generator according to claim 7 wherein the fifth active passgate is coupled between a first terminal of the third capacitor and the circuit output terminal, wherein the sixth active passgate is coupled between the first terminal of the storage capacitor and a second terminal of the third capacitance, wherein the seventh active passgate is coupled between the circuit input terminal and the first terminal of the third capacitor; and wherein the eighth active passgate is coupled between the second terminal of the third capacitor and the second voltage reference.

9. A device for controlling the slew ate of a current supplied by a power transistor having at least one control terminal and two main conduction terminals and comprising:

a circuit input terminal coupled to a first voltage reference;

a circuit output terminal for providing a controlled ramp signal;

an operational amplifier having a non-inverting input terminal connected to the circuit input terminal, and having an inverting input terminal coupled to the circuit output terminal;

a storage capacitor connected between the non-inverting input terminal of the operational amplifier and a second voltage reference, and structured to be charged by a pumping capacitor coupled between the non-inverting input terminal and the output terminal; and first and second active passgates having respective drive terminals connected to each other and to a first control terminal of the ramp generator circuit and structured to receive a first clock signal.

10. A battery-charger/battery system, in particular for use with cellular telephony, comprising a device for controlling the slew rate of a current supplied by a power transistor coupled between the battery-charger and the battery, comprising:

a circuit input terminal coupled to a first voltage reference;

a circuit output terminal for providing a controlled ramp signal, an operation amplifier having a non-inverting input terminal connected to the circuit input terminal, and having an inverting input terminal coupled to the circuit output terminal;

a storage capacitor connected between the non-inverting input terminal of the operational amplifier and a second voltage reference, and structured to be charged by a pumping capacitor coupled between the non-inverting input terminal and the output terminal; and first and second active passgates having respective drive terminals connected to each other and to a first control terminal of the ramp generator circuit and structured to receive a first clock signal.

11. A method of generating a positive ramp voltage signal and a negative ramp voltage signal, comprising:

controlling a first pair of passgates with a first clock signal;

when the first pair of passgates is in a first state, charging a first capacitor from a voltage reference;

controlling a second pair of passgates with a second clock signal;

when the second pair of passgates is in the first state, sharing the charge stored in the first capacitor between the first capacitor and a second capacitor coupled in parallel to the first capacitor;

controlling a third pair of passgates by a third clock signal; and when the third pair of passgates is in a first state, discharging a portion of the charge stored in the second capacitor to hereby generate the negative ramp voltage signal.

12. The method of claim 11 further comprising generating a third ramp voltage signal having the same direction as the first ramp signal but having a different slew rate, and generating a fourth ramp voltage signal having the same direction as the fourth ramp signal but having a different slew rate, the method comprising:

controlling a fourth pair of passgates by a fourth clock signal; and when the fourth pair of passgates is in a first state, changing a capacitance value of the first capacitor.

13. An integrated voltage ramp generator circuit comprising:

first and second passgates activated by a first signal;

a first capacitance switchably coupled by the first and second passgates, respectively, between a first reference voltage at a first terminal of the first capacitance and a second reference voltage at a second terminal of the first capacitance;

third and fourth passgates activated by a second signal;

a second capacitance switchably coupled by the third and fourth passgates, respectively, to the first capacitance at a first terminal of the second capacitance; and the second capacitance coupled to the second reference voltage at a second terminal of the second capacitance; and a differential amplifier having a non-inverting input coupled to the first terminal of the second capacitance, having an inverting input switchably coupled by the second signal to the second terminal of the first capacitance, and the inverting input coupled to an output of the differential amplifier.

14. The integrated voltage ramp generator of claim 13 wherein the first signal is a first clock signal coupled to a first and a second passgate.

15. The integrated voltage ramp generator of claim 13 wherein the second signal is a second clock signal coupled to a third and a fourth passgate.

16. A ramp voltage generating circuit, comprising an input terminal for accepting a first reference voltage;

a first switching structure coupled between the input terminal and a first terminal of a first capacitor;

a second switching structure coupled between a second terminal of the first capacitor and a second voltage reference;

a third switching structure coupled between a first terminal of the first capacitor and a first terminal of a second capacitor;

an operational amplifier having an input coupled to the first terminal of the second capacitor, and having an output terminal; and a fourth switching structure coupled between a second terminal of the operational amplifier and the second terminal of the first capacitor.

17. The ramp voltage generating circuit of claim 16 wherein each of the switching structures are passgates having a control terminal, and further comprising:

a first signal input coupled to the control terminals of the first and second passgates; and a second signal input coupled to the control terminals of the third and fourth passgates.

18. The ramp voltage generating circuit of claim 16 wherein a second terminal of the second capacitor is coupled to the second reference voltage.

19. The ramp voltage generating circuit of claim 16 wherein the output terminal of the operational amplifier is an output terminal of the ramp voltage generating circuit.

20. The ramp voltage generating circuit of claim 16, further comprising:

a fifth switching structure coupled between the first terminal of the first capacitor and the second terminal of the operational amplifier; and a sixth switching structure coupled between the first terminal of the second capacitor and the second terminal of the first capacitor.

21. The ramp voltage generating circuit of claim 20, wherein the fifth and sixth switching structures are passgates have a control terminal, the ramp voltage generating circuit further comprising a signal input coupled to the control terminals of the fifth and sixth passgates.

* * * * *

UNITED STATES PATENT AND TRADEMARK OFFICE
CERTIFICATE OF CORRECTION

PATENT NO. : 6,388,505 B1
DATED : May 14, 2002
INVENTOR(S) : Calogero Ribellino et al.

It is certified that error appears in the above-identified patent and that said Letters Patent is hereby corrected as shown below:

<u>Column 9,</u>
Line 26, "the slew ate of a current" should be corrected to read as
-- the slew rate of a current --.

Signed and Sealed this

Thirtieth Day of July, 2002

*Attest:*

*Attesting Officer*

JAMES E. ROGAN
*Director of the United States Patent and Trademark Office*